United States Patent [19]
McNaney

[11] 3,986,175

[45] *Oct. 12, 1976

[54] LIGHT OPTIC DATA HANDLING SYSTEM

[76] Inventor: Joseph T. McNaney, 8548 Boulder Drive, La Mesa, Calif. 92041

[ * ] Notice: The portion of the term of this patent subsequent to Mar. 18, 1992, has been disclaimed.

[22] Filed: Apr. 10, 1975

[21] Appl. No.: 566,916

[52] U.S. Cl. .................. 340/173 LT; 340/173 LM; 350/160 R
[51] Int. Cl.² .................. G11C 11/42; G11C 13/04
[58] Field of Search ... 340/173 R, 173 LM, 173 LS, 340/173 LT; 350/160 R

[56] References Cited
UNITED STATES PATENTS
| | | | |
|---|---|---|---|
| 3,804,488 | 4/1974 | Eden | 350/160 R |
| 3,804,489 | 4/1974 | Rumson | 350/160 R |
| 3,872,451 | 3/1975 | McNaney | 340/173 LM |

*Primary Examiner*—Terrell W. Fears

[57] ABSTRACT

The system herein includes light optic means which functions as a light beam distributor in making available, almost instantly, an information bearing beam of light at a multiplicity of output positions in the system, as opposed to many well known line scan beam deflection systems.

7 Claims, 4 Drawing Figures

LIGHT OPTIC DATA HANDLING SYSTEM

BACKGROUND OF THE INVENTION

The invention relates to the system disclosed in the U.S. Pat. No. 3,872,451 issued to this inventor Mar. 18, 1975, and utilizes therein certain teachings set forth in U.S. Pat. No. 3,804,489 concerning induced stationary diffraction gratings. Such gratings are produced by an interdigital electrode structure which is deposited on an electro-optic material. The application of a voltage to the structure produces a spatial modulation of the electro-optic material's refractive index and thereupon allowing the material to act as a diffraction grating to light incident thereon.

SUMMARY OF THE INVENTION

An information bearing light beam is directed along a primary optical path, by means of a series of reflections, and made readily available for a redirecting thereof along secondary paths, selectively, utilizing electro-optic means at any of a number of controllable light reflecting positions in the system. The light beam, or information contained therein, in combination with its output position, may thereupon be utilized in communications or for data handling purposes.

It is an object of the invention to effect light beam positioning or distribution control independent of the control system stability of more conventional beam deflection methods. These and other objects, features, and advantages of the invention will best be understood from the description which follows when read in connection with the accompanying drawing.

DETAILED DESCRIPTION OF THE INVENTION

Figure 1:
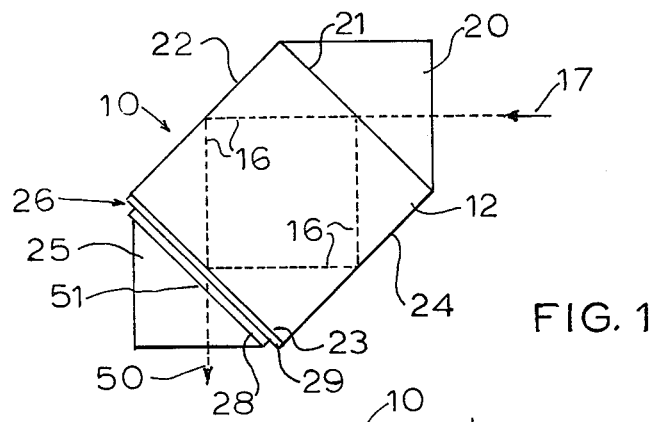
FIGS. 1 and 2 are first and second views of a light beam positioning system of the invention.
Figure 2:
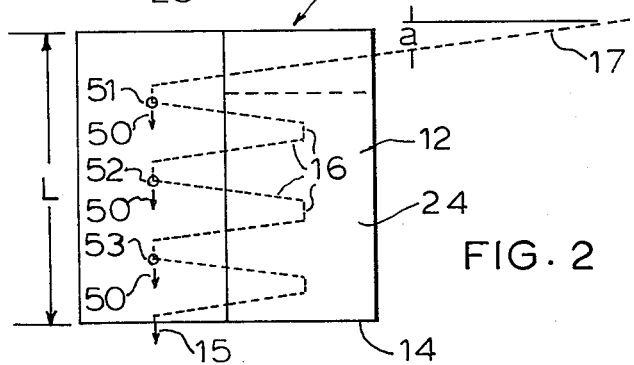

Referring now to FIGS. 1 and 2 a beam control unit 10 is illustrated which includes, for example, a four sided length of a light conducting material such as glass, plastic, crystaline material or the like, having a length L, and will be referred to as a light guide 12. Depending upon the light control requirements of the invention the guide 12 may be formed so as to present more, or less, than a four sided figure. Closely adjacent one side 21 thereof there is shown a prism 20, the material being somewhat like that of the guide 12 or of an exact material. Light, preferably from a laser source, is directed along a path 17 at an angle a, as indicated in FIG. 2. The angle indicated has been exaggerated, however, so as to simplify the discussion of the invention. Upon entering the light guide 12 the beam of light will be directed along, what will be referred to as, a primary optical path 16, spiralling its way to a point of exit 15 at the opposite end 14 of the guide 12.

Figure 3:
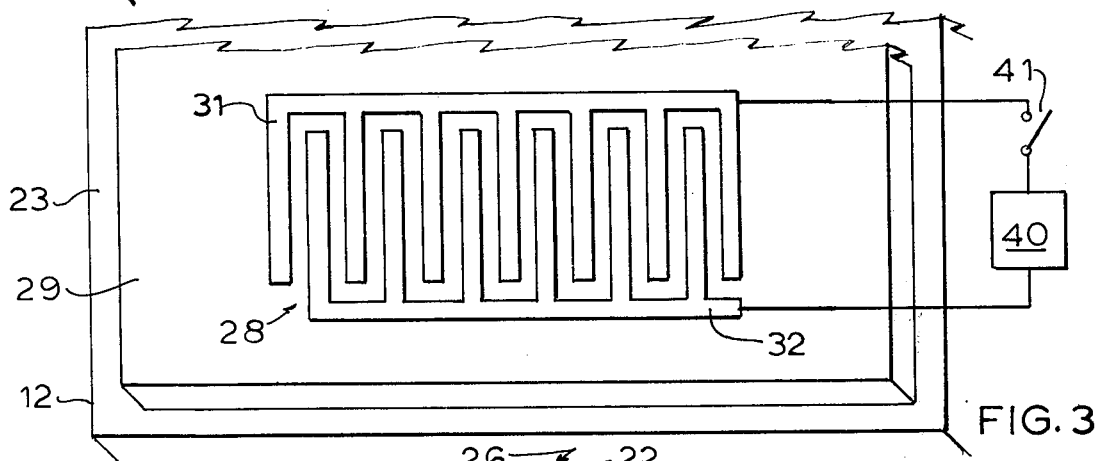
FIG. 3 is a diagramed detail of an electro-optic light beam control means of the invention.

Adjacent the side 23 of the guide 12 light conducting material having the form of a prism 25 is shown extending the length of the guide 12. Between the prism 25 and the side 23 there is an assembly of electro-optic light reflection control means 26, one of which is illustrated in FIG. 3, including a thin film of electro-optic material 29 deposited on the side 23 surface of the guide 12, and an interdigital electrode structure 28 comprised of electrodes 31 and 32, respectively. The material 29 may be that of a number of Kerr effect or Pockels effect materials in either a solid, liquid, gas or colloidal state. The electrodes can be of a light transparent electrically conductive material, tin oxide, for example. The dimensions of all Figures are of course exaggerated.

In spiralling its way through the light guide 12 the beam of light along the path 16 undergoes a series of reflections, one at each interface of the guide 12 material and media adjacent each of its sides 21, 22, 23 and 24, the media in each case presenting a lower index of refraction than that of the guide material. Upon closing a switch so as to extend the influence of an electrical potential to an individual one of the reflection control means of the assembly 26 a change in the electro-optic characteristics of the material 29 thereof will frustrate to a predetermined degree the reflection of light and allow a passing of light along a secondary path 50. Therefore, a beam of light entering the guide 12 will be reflected along a series of 360° side-by-side optical paths until reaching the point of exit 15, or, be permitted to pass along a secondary path 50, each leading from one of a plurality of light output positions 51, 52, 53, etc.

An interdigital electrode structure 28, intimately joined to the film of material 29, is positioned to coincide with each of the light output positions. When the influence of a potential is extended to an electrode structure 28, exemplified in FIG. 3 as being comprised of a potential source 40 under the control of a switch means 41, a potential difference is established between the fingers of the electrodes which results in a spatially varying change in the index of refraction in the film material 29 in the direction of light propagation. This change in the index of refraction acts as a diffraction grating for the light being directed along the path toward a given output position. Light is thereby diffracted through the material 29 and the electrode structure 28 and thereupon along an output path 50. In the absence of an induced grating the light will be deflected by the film material 29, which has a thickness, for example, of at least one wavelength, or, just thick enough so as to allow the light to be reflected without having to engage the grating of the electrode structure 28.

Figure 4:
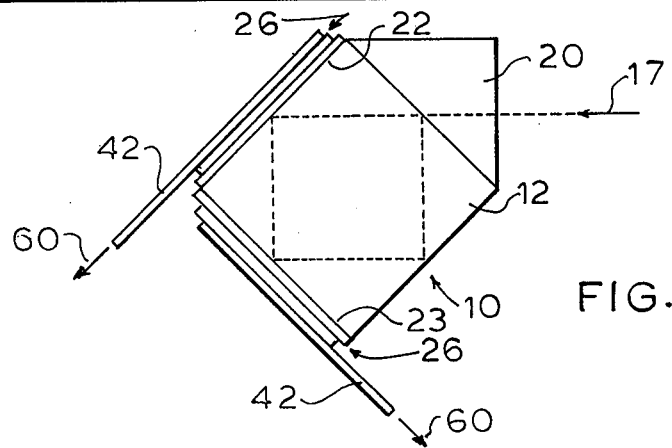
FIG. 4 is a view of a further embodiment of a light beam positioning system.

Although the use of a prism 25 is shown, depending upon light path 50 directional requirements, it may not be required. And in FIG. 4, instead of a prism, the use of another form of light guide means 42 is illustrated, being intimately joined to the electrodes 28 so as to establish a light output path 60. Also illustrated in this embodiment is the establishment of additional light output positions adjacent still another side 22 of the light guide 12, using a second assembly 26 of reflection control means. Similar assemblies may, of course, be supported adjacent the sides 21 and 24. Through the use of a light guide 12 comprised of an electro-optic material such as that of the film 29 the electrodes 31 and 32 may be intimately joined thereto and having an index matching material in the spacing therebetween, each such material having a lower index of refraction than that of the guide 12. When a potential difference is established between the fingers of the electrodes, this would result in a spatially varying change in the index of the guide 12 to the extent of providing the diffraction grating adjacent the surface 23 to a predetermined depth into the guide material. Light is thereby diffracted adjacent the interface of the light guide 12 and the electrode structure 28 and directed along an output path.

It should be understood by those skilled in the arts pertaining to the construction and application possibilities of the invention herein set forth that the embodiments included herein illustrate in a very limited sense the usefulness of the invention and that the invention includes such other modifications and equivalents as may be seen by those skilled in the arts, but still be within the scope of the appended claims.

I claim:
1. A light optic data handling system, comprising:
   a. A source of light and means for directing light therefrom along a primary optical path while undergoing a series of reflections within said system and to establish an availability of light from said source at a plurality of predetermined light output positions in said system for an electrically controlled redirecting of light along a selected one of a plurality of secondary optical paths stemming from said positions;
   b. said means including an array of light reflecting interfaces of first and second light conducting media, each said interface presenting a length dimension;
   c. said interfaces each angularly oriented so as to establish an optical relationship one with respect to the other and the path of light from said source for providing a series of 360° primary optical paths for said light, each said 360° path displaced one with respect to the other in a side-by-side relationship in the direction of said length dimension;
   d. a plurality of light reflection control means each including electro-optical material and an interdigital array of first and second light transparent electrodes intimately joined to the surface thereof having means for extending the influence of an electrical potential thereto, said control means supported in an optical light reflection control relationship with said primary optical paths at each of said light output positions in the system for controlling the passage of light to a selected one of the secondary optical paths upon the extending of said influence to a corresponding one of said control means and thereupon establishing a spatially varying change in the index of refraction in said electro-optical material.

2. A light optic data handling system, comprising:
   a. a light guide presenting a light admitting surface, a plurality of light output surfaces and a plurality of light reflecting surfaces intermediate said admitting surface and said output surfaces;
   b. a source of light and means for directing light thereof along a path toward said admitting surface;
   c. said admitting surface optically related to each of said output surfaces by means of said light reflecting surfaces, each said reflecting surface presenting a length dimension;
   d. said reflecting surfaces each oriented one with respect to the other so as to establish a plurality of 360° optical paths, each path displaced one with respect to the other in a side-by-side relationship in the direction of said length dimension for allowing light incident upon said admitting surface to be reflected to each of said output surfaces;
   e. a plurality of light reflection control means, each including electro-optic material means presenting a predetermined index of refraction and first and second electrode means, each of said reflection control means supported in a light reflection control relationship, respectively, with each of said output surfaces along said length dimension, and means for extending the influence of an electrical potential to said electrode means for controlling the passage of light through the output surfaces;
   f. each of said electro-optic material means presenting a surface, said first and second electrode means supported in a closely side-by-side relationship adjacent to the surface of the electro-optic material means, and means for effecting a change in the index of refraction of the electro-optic material means optically related to a selected one of said output surfaces upon the extending of said influence to corresponding first and second electrode means and thereby allowing a passing of light through the selected one of said output surfaces.

3. The invention as set forth in claim 2, wherein
   g. said electrode means includes an interdigital array of first and second light transparent electrical conductors for establishing a spatially varying change in the predetermined index of refraction of the electro-optic material means upon the extending of the influence of an electrical potential to said electrode means.

4. The invention as set forth in claim 2, wherein
   g. said electro-optic material means is intimately joined with predetermined ones of said output surfaces of the light guide along said length dimension.

5. The invention as set forth in claim 2, wherein
   g. said electro-optic material means is included in the formation of said light guide.

6. A light optic data handling system, comprising:
   a. a source of light and means for directing light therefrom along a primary optical path while undergoing a series of reflections within said system and to establish an availability of light from said source at a plurality of predetermined light output positions of said system for an optically controlled redirecting of light along a selected one of a plurality of secondary optical paths stemming from said positions;
   b. said means including an array of light reflecting interfaces of first and second light conducting media presenting, respectively, first and second indices of refraction, each of said interfaces presenting a length dimension;
   c. said interfaces each angularly oriented so as to establish an optical relationship one with respect to the other and to the path of light from said source for providing a series of 360° primary optical paths for said light, each said 360° path displaced one with respect to the other in a side-by-side relationship in the direction of said length dimension;
   d. a plurality of light reflection control means for establishing, selectively, a spatially varying change in the index of refraction of said second light conducting media coincident with the interface of said first and second media at each of said light output positions for effecting a passing of light through the interface of a selected one of said output positions and along a secondary optical path thereof.

7. A light optic data handling system, comprising:
   a. a light admitting surface;

b. a source of light and means for directing light therefrom along an input path toward said admitting surface and thereupon along a primary optical path while undergoing a series of light reflections within said system so as to establish an availability of light from said source at a plurality of predetermined light output positions of said system for an optically controlled redirecting of light along a selected one of a plurality of secondary optical paths stemming from said output positions;

c. said means including an array of light reflecting interfaces of first and second light conducting media presenting, respectively, first and second indices of refraction, each of said interfaces presenting a length dimension and each angularly oriented so as to establish an optical relationship one with respect to the other, with respect to said input path, and with respect to each said secondary optical path, said array of interfaces providing a series of 360° primary optical paths for said light, each said 360° path displaced one with respect to the other in a side-by-side relationship in the direction of said length dimension;

d. said output positions extending along said length dimension adjacent at least one interface of first and second light conducting media of said array of interfaces, light reflection control means supported in a light reflection control relationship with said one interface for establishing a spatially varying change in the index of refraction of at least one of said media coincident with said one interface for effecting, selectively, a passing of light along a secondary path stemming from said output positions.

* * * * *